(12) United States Patent
Ross

(10) Patent No.: US 6,271,146 B1
(45) Date of Patent: Aug. 7, 2001

(54) ELECTRON BEAM TREATMENT OF FLUORINATED SILICATE GLASS

(75) Inventor: Matthew F. Ross, La Jolla, CA (US)

(73) Assignee: Electron Vision Corporation, San Diego, CA (US)

( * ) Notice: Subject to any disclaimer, the term of this patent is extended or adjusted under 35 U.S.C. 154(b) by 0 days.

(21) Appl. No.: 09/408,927

(22) Filed: Sep. 30, 1999

(51) Int. Cl.[7] ................................................. H01L 21/00
(52) U.S. Cl. ............................ 438/723; 216/66; 216/80; 438/672; 438/743
(58) Field of Search ........................... 216/65, 66, 80, 216/76, 97; 438/707, 672, 710, 723, 743, 756

(56) References Cited

U.S. PATENT DOCUMENTS

| 5,003,178 | 3/1991 | Livesay | 250/492.3 |
| 5,759,906 | 6/1998 | Lou | 438/623 |
| 5,876,798 | 3/1999 | Vassiliev | 427/255.3 |

FOREIGN PATENT DOCUMENTS

| 11121451 | 4/1999 | (JP) . |
| WO 97/00535 | 1/1997 | (WO) . |

OTHER PUBLICATIONS

Takeishi, S. et al Stabilizing Dielectric Constants of Fluorine–Doped SiO2 Films by NO2– Plasma Annealing; DUMIC Conference Proceedings, Feb. 21, 1995; pp. 257–259.

Primary Examiner—William A. Powell
(74) Attorney, Agent, or Firm—Roberts & Mercanti L.L.P.

(57) ABSTRACT

The invention pertains to dielectric films for the production of microelectronic devices. A relatively stabile fluorinated silicate glass film is produced by depositing a fluorinated silicate glass film onto a substrate and then exposing the fluorinated silicate glass film to electron beam radiation. The electron beam exposing step is conducted by overall exposing the dielectric layer with a wide, large beam of electron beam radiation from a large-area electron beam source.

23 Claims, 3 Drawing Sheets

ELECTRON BEAM TREATMENT OF FLUORINATED SILICATE GLASS

BACKGROUND OF THE INVENTION

1. Field of the Invention

The invention pertains to dielectric films, more particularly the invention pertains to stabilized fluorosilicate glass films which are useful for the production of microelectronic devices.

2. Description Of The Related Art

The semiconductor industry is rapidly decreasing the dimensions and increasing the density of circuitry and electronic components in silicon chips and integrated circuits. In addition, integrated circuits are being layered or stacked with ever decreasing insulating layer thickness between each circuitry layer.

In the production of advanced integrated circuits that have minimum feature sizes of 0.25 micrometers and below, problems of interconnect RC delay, power consumption and crosstalk become significant. With these decreasing geometries and device sizes, the semiconductor industry has sought to avoid parasitic capacitance and crosstalk noise caused by inadequate insulating layers in the integrated circuits. One way to achieve the desired low RC delay constants involves use of dielectric material in insulating layers that have a low dielectric constant. The use of low dielectric constant (K) materials for interlevel dielectric and intermetal dielectric applications partially mitigate these problems. However, the material candidates which are used by the industry, having dielectric constants significantly lower than the currently employed dense silica, suffer from disadvantages. Most low dielectric constant materials developments use spin-on-glasses and fluorinated plasma chemical vapor deposition $SiO_2$ with K of greater than 3.

Silicon dioxide is frequently used as an insulator or as a gate material on silicon-based integrated circuits. Typical applications of thin silicon dioxide films include protective coatings, gate insulators for field effect transistors, passivation or inter-metal layers for elemental and compound semiconductor devices, and capacitor dielectrics for memory devices. A film that is commonly used for this purpose is fluorinated silicon oxide. Incorporation of fluorine into the SiO lattice reduces its dielectric constant due to fluorine's high electronegativity and low polarizability. Incorporation of fluorine into silicon dioxide can also reduce radiation-induced oxide charges, and improve the hot-electron immunity of the dielectric. Previous approaches to depositing fluorinated silicon oxide films have included plasma enhanced chemical vapor deposition, electron cyclotron resonance plasma chemical vapor deposition, and atmospheric pressure chemical vapor deposition using Si precursors such as $SiF_4$. The incorporation of fluorine maintains the physical properties of the films, while improving their electrical properties, such as reducing failures due to early dielectric breakdowns, enhancing performance as an insulator, and reducing the presence of unwanted electrical charges within the silicon dioxide lattice. The formation of fluorinated silicate glass (FSG) dielectric layers for use in microelectronic devices is known from U.S. Pat. Nos. 5,492,736; 5,643,640; 5,660,895; 5,807,785; 5,876,798; 5,888,905 and 5,939,831 which are incorporated herein by reference.

The difficulty of integrating FSG into semiconductor devices is due to the instability of the fluorine in the silicon dioxide film. The fluorine is added to the film to lower the dielectric constant and the amount of fluorine is limited by the stability of the fluorine in the film. If the fluorine is not stable in the film it can produce several detrimental results. These include migration to active areas of the device, corrosion of the metal or other materials in the device, and degradation of the dielectric constant. Successful implementation of FSG has been limited due to the technical challenges of maintaining a stable film with a low dielectric constant.

By incorporating fluorine into the $SiO_2$ film a dielectric constant in the range of 3.0 to 3.5 can be achieved depending on the amount of fluorine in the film. Being able to use fluorinated $SiO_2$ is advantageous because existing oxide CVD processes can be extended to future device generations that require a dielectric constant of less than that of standard oxide which is 3.8 to 4.2. This would provide a cost advantage to device manufacturers because they can extend their existing oxide CVD equipment with minimal cost.

There has been some process development using plasma treatments of the FSG films to try and stabilize the fluorine in the film. These processes have the drawback that they are surface treatments and cannot affect changes in the bulk of the FSG film. Plasma processing has not had a significant impact on the amount of fluorine that can be included to provide a lower dielectric constant. Thus, this type of processing has only been marginally accepted. There is a continued desire to provide a more stable low dielectric constant FSG film that is a production worthy process. U.S. Pat. No. 5,946,601 shows a method for decreasing fluorine outdiffusion by depositing a fluorine barrier layer between a metal layer and a low k material. The fluorine barrier layer is amorphous hydrogenated carbon nitride or amorphous carbon nitride.

The present invention applies an electron beam treatment to the FSG film to stabilize the fluorine in the oxide structure of the film. Because the electrons can penetrate the entire thickness of the FSG film, they can modify the properties of the FSG film through the bulk of the film. The electron beam reduces the moisture in oxide films as well as reduces the hydrogen level in oxide films. This reduces the potential for the fluorine to interact with moisture or hydrogen and form HF acid which contributes to the corrosion of the metals and other materials in the device structure. The electron beam also densifies oxide films which leads to a more stable film. The electron beam may allow for some amount of the fluorine to leave the film, eliminating excess fluorine, and this would provide a more stable FSG film as these fluorine atoms would no longer be able to move or react within the FSG film.

SUMMARY OF THE INVENTION

The invention provides a process for producing a fluorinated silicate film which comprises depositing a fluorinated silicate film onto a substrate and then exposing the fluorinated silicate film to electron beam radiation.

The invention also provides a process for stabilizing fluorinated silicate film which comprises exposing a fluorinated silicate film to electron beam radiation under conditions sufficient to stabilize the fluorinated silicate film compared to the fluorinated silicate film prior to such exposure.

The invention further provides a microelectronic device which comprises a substrate, and a fluorinated silicate film on the substrate, which fluorinated silicate film has been exposed to electron beam radiation under conditions sufficient to stabilize the fluorinated silicate film compared to the fluorinated silicate film prior to such exposure.

The invention still further provides a process for producing a microelectronic device which comprises:

(a) applying a fluorinated silicate film onto a substrate;
(b) exposing the fluorinated silicate film to electron beam irradiation under conditions sufficient to stabilize the fluorinated silicate film compared to the fluorinated silicate film prior to such exposure.
(c) imagewise patterning the fluorinated silicate film to form vias in the film extending to the substrate;
(d) optionally patterning the fluorinated silicate layer to form trenches in the film;
(e) depositing a metal into the vias, the optional trenches, and onto a top surface of the fluorinated silicate layer;
(f) removing the metal from the top surface of the fluorinated silicate layer.

DETAILED DESCRIPTION OF THE PREFERRED EMBODIMENT

Figure 1:
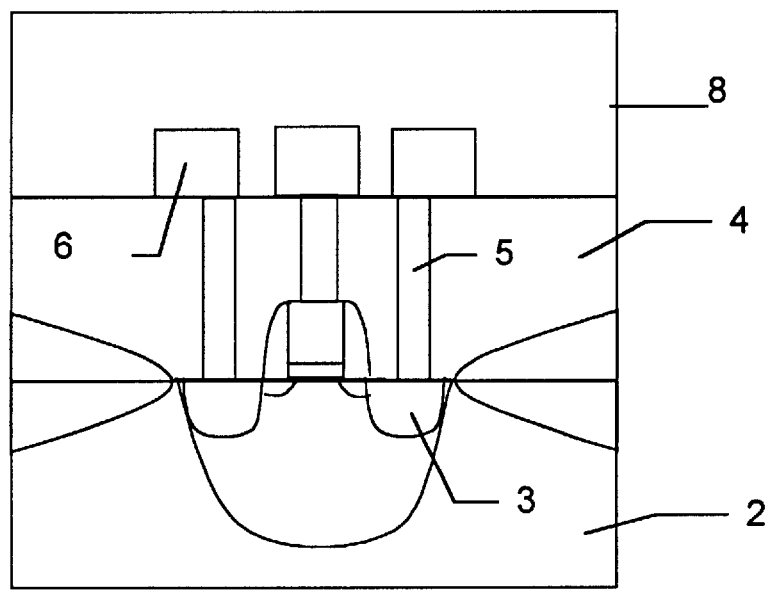
FIG. 1 shows a fluorinated silicate film deposited on a substrate.

As a first step in the process of the invention, a fluorinated silicate such as a fluorinated silicate glass, for example a fluorinated silicon dioxide film is deposited onto a substrate by any means known in the art.

Typical substrates are those suitable to be processed into an integrated circuit or other microelectronic device. Suitable substrates for the present invention non-exclusively include semiconductor materials such as gallium arsenide (GaAs), germanium, lithium niobate, silicon and compositions containing silicon such as silicon germanium, crystalline silicon, polysilicon, amorphous silicon, epitaxial silicon, and silicon dioxide ($SiO_2$) and mixtures thereof On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer.

The fluorinated silicate film may be applied to the substrate via chemical vapor deposition such as by low pressure chemical vapor deposition LPCVD, plasma-enhanced chemical vapor deposition PECVD, atmospheric pressure chemical vapor deposition APCVD, or subatmospheric chemical vapor deposition SACVD. One method of fluorinated silicon oxide film deposition is taught in U.S. Pat. No. 5,876,798 where films of fluorinated silicon oxide are deposited by means of CVD at reduced pressure using fluorotriethoxysilane (FTES) and tetra-exthyloxysilane (TEOS) as the precursors, together with ozone (mixed with oxygen). A CVD reaction chamber is maintained at a temperature between about 400° C. and 500° C. and at a pressure between about 200 and 260 torr. The thickness of the deposited layer is from about 1,000 to about 20,000 Angstroms.

Other methods of forming films of fluorinated silicon oxide are taught in U.S. Pat. Nos. 5,807,785 and 5,660,895 and 5,492,736. Using, a PECVD process tetraethoxysilane (TEOS) and a fluorine-containing compound may create a layer with a dielectric constant of less than 4.0, preferably approximately 3.5. In a preferred embodiment, the fluorine compounds used are $SiF_4$ or $C_2F_6$. Film deposition may be conducted with a Plasma Therm model VII-70 PECVD system or a Vactronics Model PECVD-2000-M. The plasma enhanced chemical vapor deposition (PECVD) of silicon oxyfluoride films may be carried out using a liquid source and oxygen as a reactive gas. Oxygen and vapors of the source are introduced into the reactor. Source material is introduced at 10–200 sccm and $O_2$ is introduced at between 10 and 200 sccm into the reactor. A heating element is maintained at from about 100° C. to about 600° C., and the total pressure of the reactor is from about 100 mT to about 2 Torr. Plasma power is maintained at from about 50 to about 100 watts of power by a plasma generating system. The deposition rates obtained using these conditions are from about 50 to about 250 angstroms per minute and exhibit an index of refraction of from about 1.377 to about 1.406. These indices of refraction increase with time when exposed to air. Chemical vapor deposition processes are well known to those skilled in the art and chemical vapor deposition reactors are widely commercially available. One suitable reactor is model SK-23-6-93 commercially available from Vactronic Equipment Labs of Bohemia, N.Y.

The film is then treated by exposing it to a flux of electrons. Such a treatment is performed by placing the coated substrate inside the chamber of a large area electron beam exposure system, such as that described in U.S. Pat. No. 5,003,178 to Livesay, the disclosure of which is incorporated herein by reference. This apparatus exposes the entire film to a flood electron beam flux all at once. The period of electron beam exposure will be dependent on the total dosage applied, the electron beam energy applied to the film and the beam current density. One of ordinary skill in the art can readily optimize the conditions of exposure. Preferably the electron beam exposure is done at a vacuum in the range of from about $10^{-5}$ to about $10^2$ torr, and with a substrate temperature in the range of from about 20° C. to about 600° C. more preferably from about 100° C. to about 500° C. When the electron beam is used both for fluorine stabilization and surface treatment, energy will fall into the range of from about 0.5 to about 100 KeV, preferably from about 1 to about 20 KeV and more preferably from about 1 to about 8 KeV. The electron beam exposing is preferably conducted from a source which generates an electron beam current of from about 1 to about 150 mA more preferably, from about 1.0 mA to about 30 mA. The electron beam dose will fall into the range of from about 1 to about 500,000 $\mu C/cm^2$, preferably from about 100 to about 10,000 $\mu C/cm^2$, and more preferably from about 100 to about 10,000 $\mu C/cm^2$. The dose and energy selected will be proportional to the thickness of the film to be processed. The appropriate doses and energies may easily be determined by those skilled in the art for the case at hand. Generally the exposure will range from about 0.5 minute to about 120 minutes, and preferably from about 1 minute to about 60 minutes. The film coated substrate may be exposed to electron beams in any chamber having a means for providing electron beam radiation to substrates placed therein. The film is preferably subjected to an electron beam radiation from a uniform large-area electron beam source under conditions sufficient to stabilize the full width and full thickness of the fluorinated silicate film. Preferably the exposure is conducted with an electron beam which covers an area of from about 4 square inches to about 256 square inches. The gaseous ambient in the electron beam system chamber may be nitrogen, oxygen, hydrogen, argon, xenon, helium, ammonia, forming gas, silane, a blend of hydrogen and nitrogen, ammonia and mixtures thereof Optionally one may prepare a microelectronic device by first depositing a substrate with an unfluorinated silicate glass film on its surface by CVD deposition; then depositing a fluorinated silicate glass on the unfluorinated silicate glass film; exposing the fluorinated silicate glass film to electron beam radiation; and then depositing another unfluorinated silicate glass film on the exposed fluorinated silicate glass film.

In use, in a first embodiment, an un-doped silicate glass (USG) film is deposited over a substrate. This layer acts as a barrier to fluorine diffusion and protects the conductor metal. The fluorinated silicate glass (FSG) layer is deposited via CVD techniques as an inter-metal dielectric and gap-fill film. The substrate is moved into a large area electron beam exposure system and exposed with the appropriate level of electron beam dose, at the required energy so that the electrons can treat the entire thickness of the FSG film, with the desired current and at the necessary temperature level, with the necessary process gas. The treated FSG layer is coated with a capping layer of USG to prevent upward diffusion of the fluorine and to provide a layer to polish using CMP. The substrate is further processed according to the production process flow of the device under consideration.

In a second embodiment, a fluorinated silicate glass (FSG) film is applied to a substrate via chemical vapor deposition by well known LPCVD, PECVD, APCVD, or SACVD processes. The FSG film is used as an inter-metal dielectric which also provides some level of gap-fill between metal lines. The substrate is moved into a large area electron beam exposure system and exposed with the appropriate level of electron beam dose, at the required energy so that the electrons can treat the entire thickness of the FSG film, with the desired current and at the necessary temperature level, with the necessary process gas. The substrate is further processed according to the production process flow of the device under consideration.

Figure 2:
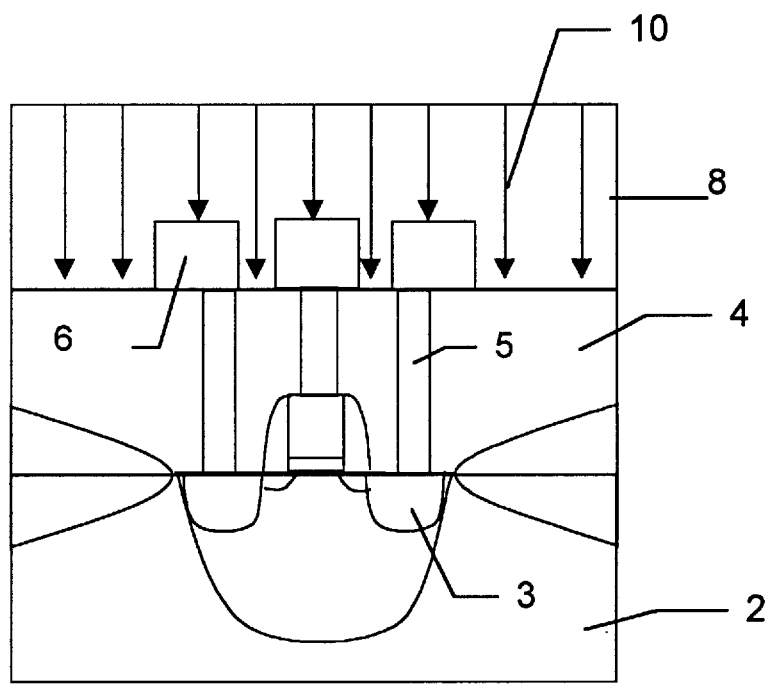
FIG. 2 shows the fluorinated silicate film being exposed by an electron beam.

Referring to the drawings, FIG. 1 shows a substrate 2, having a microelectronic device 3 on its surface including a silicon dioxide via level dielectric layer 4 with vias 5 therethrough. Metal lines 6 connect to the underlying device 3 by means of the vias 5. A layer of a fluorinated silicate glass film 8 is on the metal lines 6 and the top surface of the silicon dioxide. FIG. 2 shows the fluorinated silicate glass film being exposed through its entire thickness and across its entire width by a wide beam electron beam 10. The electron beam range (depth) is matched to the thickness of the fluorinated silicate glass film.

Figure 3:
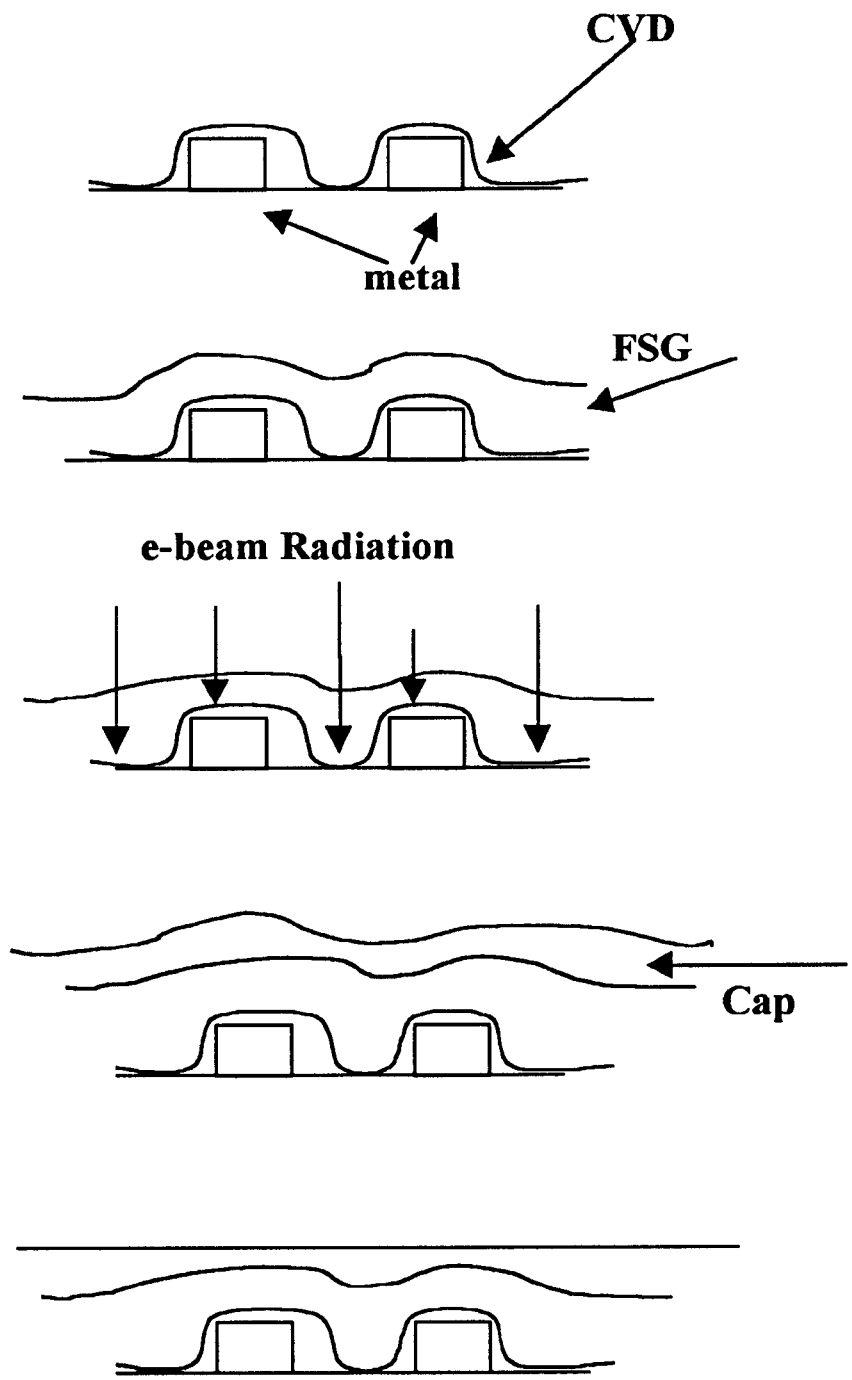
FIG. 3 shows a schematic representation of an electron beam modification of fluorinated silicate.

FIG. 3 shows a schematic representation of an electron beam modification sequence for fluorinated silicate glass. A substrate having metal lines which is deposited with silicon dioxide diffusion barrier layer by a CVD process. Thereafter a FSG layer is deposited over the silicon dioxide layer. The FSG layer is then exposed to electron beam radiation across its width and through its depth. Thereafter another layer of silicon dioxide is deposited on the FSG layer and subsequently planarized.

Figure 4:
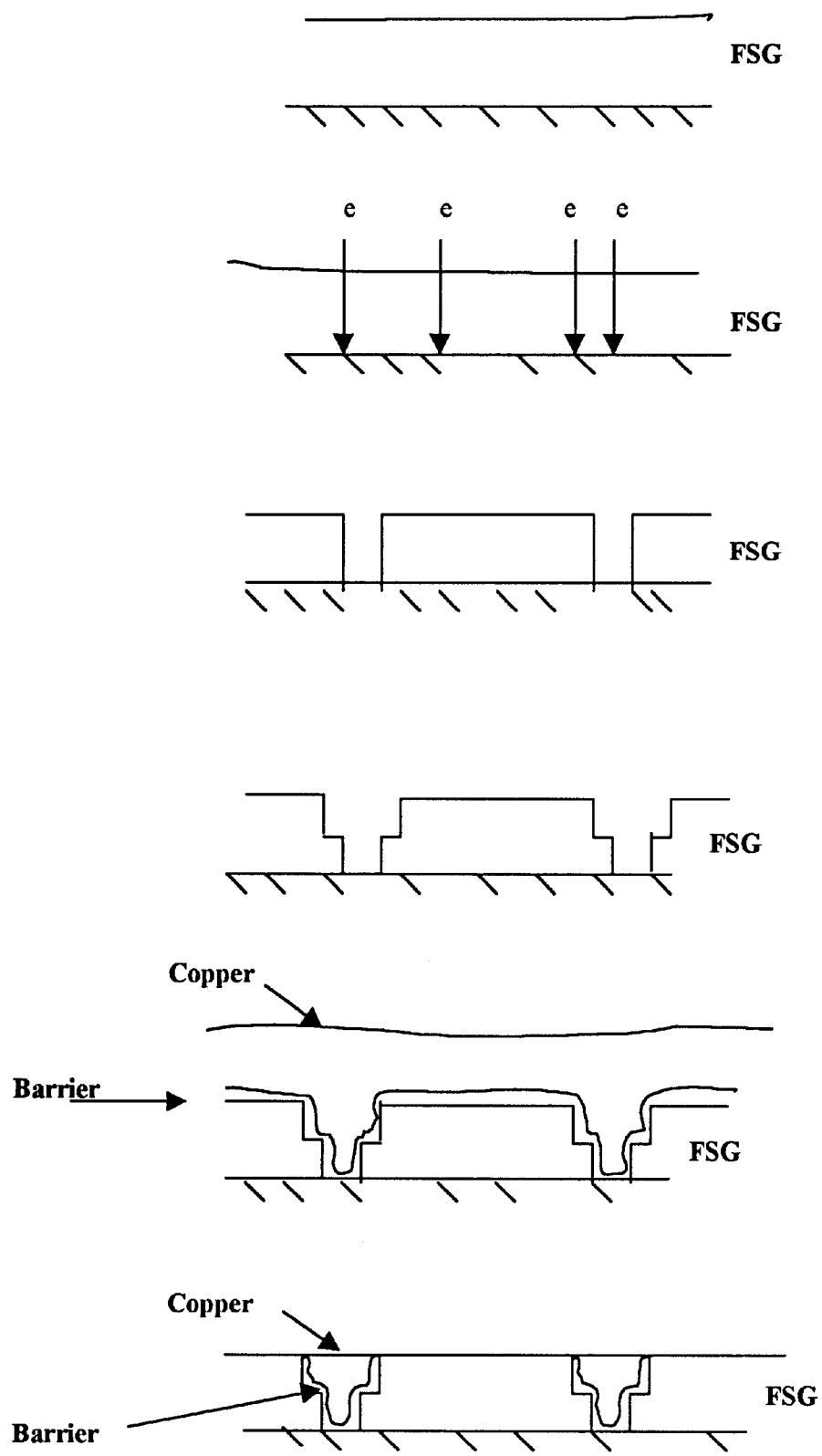
FIG. 4 shows a schematic representation of an electron beam modification of fluorinated silicate in a Damascene process.

FIG. 4 shows a schematic representation of an electron beam modification of fluorinated silicate glass in a Damascene process. A layer of FSG is deposited onto a substrate by a CVD process. The FSG layer is then exposed to electron beam radiation across its width and through its depth. The FSG layer is then patterned and etched to form vias through the FSG layer. This step is done using standard lithographic techniques well known to the skilled artisan. Then trenches are likewise formed in the FSG layer by lithographic patterning and etching. The vias and trenches are then deposited with a barrier metal layer, a seed metal and then plated with copper. The copper layer is then polished back to the FSG film by a chemical mechanical polishing treatment.

Vias and trenches are formed in the dielectric layer by well known photolithographic techniques using a photoresist composition. Such are formed in a manner well known in the art such as by coating the top of the FSG layer with a photoresist, imagewise exposing to actinic radiation such as through a suitable mask, developing the photoresist and etching away portions of the FSG layer. The photoresist composition may be positive working or negative working and are generally commercially available. Suitable positive working photoresists are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the nonimage portions and define a via mask. Vias are then formed by etching techniques which are well known in the art. Next the photoresist is completely removed from the FSG dielectric surface and the inside walls of the vias by plasma etching. Plasma generators which are capable of are described in U.S. Pat. Nos. 5,174,856 and 5,200,031. Trenches may optionally be formed in the same manner.

Next the vias and optional trenches are filled with a conductive metal which fills the vias and optional trenches on top of the FSG layer as shown in FIG. 4. Suitable metals include aluminum, aluminum alloys, copper, copper alloys, tantalum, tungsten, titanium or other metal typically employed in the formation of microelectronic devices. The metal may be applied by such techniques as vapor deposition, sputtering, evaporation and the like. The thickness of the metal layers is preferably from about 3000 to 5000 Angstroms. Typically the metal is applied by first forming a barrier metal and seeding layer on the walls of the vias and the FSG layer. Then the balance of the metal is applied. The barrier metal serves to prevent diffusion of the conductive metal into the dielectric layers. Barrier metal may be, for example, a nitride such Ti, TaN or TiN. Next the metal layer is removed back to the FSG layer by chemical mechanical polishing or an etch back by techniques which are well known in the art. The FSG layer acts as a polish stop and the resulting microelectronic device shown at the bottom of FIG. 4.

The following non-limiting examples serve to illustrate the invention.

EXAMPLE 1

Deposition of silicon oxyfluoride film onto a silicon substrate from difluorodiethyl silane and oxygen is carried out by flowing vapors of difluorodiethyl silane into a PECVD reactor at between 11 and 18 sccm, flowing $O_2$ into the chamber at between 5 and 8 sccm, while maintaining heating at between 345° C. and 400° C., a total pressure between 780 and 1000 mTorr and supplying between 73 to 100 watts of power to the plasma generating system. The deposition rate of the silicon oxyfluoride film deposited using 18 sccm difluorodiethyl silane, 8 sccm O2, heater temperature 400° C., total pressure 800 mTorr, and plasma power of 100 W is 33 angstroms per minute. Electron beam exposure is then conducted in an ElectronCure™ 30 chamber incorporating a large area electron source and quartz lamps for heating the wafer. The cold-cathode source produces a large area electron beam (over 200 mm in diameter) having a substantially uniform emission over its entire surface. Electron emission is controlled by the low bias voltage applied to the anode grid. The electron beam penetration depth depends on the FSG thickness. Electron beam exposure was conducted at a temperature of 350° C. and in an argon atmosphere (10–30 milliTorr).

EXAMPLE 2

A thin film of fluorinated silicon dioxide is formed on a 4" silicon wafer having a silicon dioxide layer on its surface, using a conventional CVD technique. The film thickness after the deposition process is in the range of 8000 to 10000 Å.

The dielectric coated wafer is then inserted into a cluster tool having interconnected CVD and electron beam exposure modules. A vacuum is applied through the entire tool including the electron beam exposure module. The wafer is transported to the electron beam exposure module where it is exposed to electron beam radiation using a large area electron source while being heated. The cold-cathode source produces a large area electron beam (over 200 mm in diameter) having a substantially uniform emission over its entire surface. Electron emission is controlled by the low bias voltage applied to the anode grid. The electron beam penetration depth is about 1000 Å.

Electron beam exposure was conducted at a temperature of 200° C. and in an argon atmosphere (10–30 milliTorr). Without breaking the vacuum, the treated wafer is transported to the chemical vapor deposition module where the surface of the dielectric polymer is then applied with a capping layer of silicon dioxide by chemical vapor deposition.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A process for producing a fluorinated silicate film which comprises depositing a fluorinated silicate film onto a substrate and then exposing the fluorinated silicate film to electron beam radiation.

2. The process of claim 1 wherein the exposing is conducted by overall flood exposing substantially the entire thickness of substantially the whole area of the fluorinated silicate film to sufficient electron beam radiation to stabilize the fluorinated silicate film compared to the fluorinated silicate film prior to such exposure.

3. The process of claim 1 wherein the fluorinated silicate film comprises fluorinated silicon dioxide.

4. The process of claim 1 wherein the fluorinated silicate film is deposited via chemical vapor deposition.

5. The process of claim 1 comprising depositing an unfluorinated silicate film onto a surface of the substrate, then depositing the fluorinated silicate onto the unfluorinated silicate film, exposing the fluorinated silicate film to electron beam radiation and then depositing another unfluorinated silicate film onto the exposed fluorinated silicate film.

6. The process of claim 5 wherein the fluorinated silicate film comprises fluorinated silicon dioxide.

7. The process of claim 6 wherein the unfluorinated silicate film comprises silicon dioxide.

8. The process of claim 1 wherein the substrate comprises a semiconductor material.

9. The process of claim 1 wherein the substrate comprises a material selected from the group consisting of gallium arsenide, germanium, silicon, silicon germanium, lithium niobate, crystalline silicon, polysilicon, amorphous silicon, epitaxial silicon, silicon dioxide and mixtures thereof.

10. The process of claim 1 wherein the substrate has a pattern of lines on its surface wherein the lines comprise a metal, an oxide, a nitride or an oxynitride.

11. The process of claim 1 wherein the substrate has a pattern of lines on its surface wherein the lines comprise a material selected from the group consisting of silica, silicon nitride, titanium nitride, tantalum nitride, aluminum, aluminum alloys, copper, copper alloys, tantalum, tungsten and silicon oxynitride.

12. The process of claim 1 wherein the electron beam exposing step is conducted at an energy level ranging from about 0.5 to about 100 KeV.

13. The process of claim 1 wherein the electron beam exposing is from a source which generates an electron dose ranging from about 1 to about 500,000 $\mu C/cm^2$.

14. The process of claim 1 wherein the electron beam exposing is conducted from a source which generates an electron beam current of from about 1 to about 150 mA.

15. The process of claim 1 wherein the electron beam exposing is conducted while heating the substrate to a temperature of from about 20° C. to about 600° C.

16. The process of claim 1 wherein the electron beam exposing is conducted while the substrate is under a pressure maintained in the range of from about $10^{-5}$ to about $10^2$ torr.

17. The process of claim 1 wherein the electron beam exposing is conducted in a gas selected from the group consisting of nitrogen, oxygen, hydrogen, argon, xenon, helium, ammonia, forming gas, silane, a blend of hydrogen and nitrogen, ammonia and mixtures thereof.

18. The process of claim 1 wherein the electron beam exposing step is conducted by overall exposing the fluorinated silicate film with a wide, large beam of electron beam radiation from a large-area electron beam source.

19. The process of claim 1 wherein the electron beam exposing step is conducted by overall exposing the fluorinated silicate film with a wide, large beam of electron beam radiation from a uniform large-area electron beam source which covers an area of from about 4 square inches to about 256 square inches.

20. A process for stabilizing fluorinated silicate film which comprises exposing a fluorinated silicate film to electron beam radiation under conditions sufficient to stabilize the fluorinated silicate film compared to the fluorinated silicate film prior to such exposure.

21. A microelectronic device which comprises a substrate, and a fluorinated silicate film on the substrate, which fluorinated silicate film has been exposed to electron beam radiation under conditions sufficient to stabilize the fluorinated silicate film compared to the fluorinated silicate film prior to such exposure.

22. The microelectronic device of claim 21 which comprises a substrate, an unfluorinated silicate film on a surface of the substrate, a fluorinated silicate on the unfluorinated silicate film, which fluorinated silicate film has been exposed to electron beam radiation and another unfluorinated silicate film on the exposed fluorinated silicate film.

23. A process for producing a microelectronic device which comprises:

(a) applying a fluorinated silicate film onto a substrate;

(b) exposing the fluorinated silicate film to electron beam irradiation under conditions sufficient to stabilize the fluorinated silicate film compared to the fluorinated silicate film prior to such exposure;

(c) imagewise patterning the fluorinated silicate film to form vias in the film extending to the substrate;

(d) optionally patterning the fluorinated silicate film to form trenches in the film;

(e) depositing a metal into the vias, the optional trenches, and onto a top surface of the fluorinated silicate film;

(f) removing the metal from the top surface of the fluorinated silicate layer.

* * * * *